United States Patent
Yoshida et al.

(10) Patent No.: US 6,931,334 B2
(45) Date of Patent: Aug. 16, 2005

(54) APPARATUS FOR AND METHOD OF CALCULATING ELECTROMAGNETIC FIELD INTENSITY, AND COMPUTER PROGRAM PRODUCT

(75) Inventors: Hiroshi Yoshida, Kawasaki (JP); Masamichi Ohtake, Kobe (JP); Yasuhiro Hayakawa, Kobe (JP); Yasuo Matsubara, Kobe (JP); Kenji Nagase, Kawasaki (JP); Takashi Yamagajo, Kawasaki (JP)

(73) Assignees: Fujitsu Limited, Kawasaki (JP); Fujitsu Ten Limited, Kobe (JP)

( * ) Notice: Subject to any disclaimer, the term of this patent is extended or adjusted under 35 U.S.C. 154(b) by 12 days.

(21) Appl. No.: 10/764,521

(22) Filed: Jan. 27, 2004

(65) Prior Publication Data
US 2004/0204877 A1 Oct. 14, 2004

(30) Foreign Application Priority Data

Mar. 26, 2003 (JP) .......................... 2003-086398

(51) Int. Cl.$^7$ .......................... G01R 27/00; G01R 33/00
(52) U.S. Cl. ................. 702/65; 702/117; 324/76.11; 324/600
(58) Field of Search ................... 702/57, 60, 64, 702/65, 115, 117; 324/260, 600, 76.11–76.14, 650, 96, 103 R

(56) References Cited

U.S. PATENT DOCUMENTS 6,185,517 B1 * 2/2001 Ohtsu et al. ................ 703/4

FOREIGN PATENT DOCUMENTS

JP        7-302278 A       11/1995

* cited by examiner

Primary Examiner—Marc S. Hoff
Assistant Examiner—Manuel L. Barbee
(74) Attorney, Agent, or Firm—Staas & Halsey LLP

(57) ABSTRACT

An electromagnetic field intensity calculation apparatus calculates a virtual current vector from a voltage vector and a mutual immittance matrix of an object including a wave source where a wave source power is applied. The voltage vector and the mutual immittance use a wave voltage of the wave source as a unit voltage. The apparatus also calculates an input impedance of the wave source based on a virtual wave source current of the virtual current vector and a unit voltage of the wave source, and calculates the wave source voltage based on the input impedance and the wave source power. The apparatus further calculates a current vector based on the wave source voltage calculated and the virtual current vector, and calculates an electromagnetic field intensity around the wave source which is determined based on the current vector.

3 Claims, 5 Drawing Sheets

APPARATUS FOR AND METHOD OF CALCULATING ELECTROMAGNETIC FIELD INTENSITY, AND COMPUTER PROGRAM PRODUCT

BACKGROUND OF THE INVENTION

1) Field of the Invention

The present invention relates to an apparatus for and a method of calculating electromagnetic field intensity in which, when a wave source power is applied, an electromagnetic field intensity can be calculated based on a moment method.

2) Description of the Related Art

Conventionally, an electromagnetic field intensity calculation apparatus that calculates an electromagnetic field intensity around a wave source applied with a wave source power based on a current vector calculated using a mutual immittance matrix of a subject having a wave source and a voltage vector is known. Such an electromagnetic field intensity calculation apparatus applies a moment method to an integral equation derived from Maxwell electromagnetic wave equation to calculate a current of a three-dimensional object with any shape through a numerical analysis.

Specifically, an object is divided into a finite number of small elements, the above-described integral equation is multiplied by a weight function defined within the elements so as to perform integration within the elements so that a matrix regarding mutual immittance matrix about the finite number of elements, and a determinant regarding a voltage vector and a current vector are obtained. A wave source voltage is given so that the determinant is solved so as to meet such a boundary condition that an electric field on a metal surface is zero, thus the current vector of the object is obtained. Further, a radiating electromagnetic field intensity is calculated based on the current of the object obtained in this manner.

For example, Japanese Patent Application Laid-Open No. H07-302278 discloses a conventional art in which a determinant is solved so as to meet such a boundary condition that, when a wave source voltage is applied, an electric field on a metal surface is zero, so that an electromagnetic field intensity is calculated at higher accuracy by calculating not only a current flowing in a printed board but also a common mode current flowing in a cable, a wire, a lead, and a casing.

In recent years, however, when an electromagnetic field intensity of a portable phone or the like is calculated, a wave source power is applied instead of the wave source voltage in many cases. However, the conventional art is a technique constituted to calculate an electromagnetic field intensity by solving the determinant so as to meet such a boundary condition that the electric field on a metal surface is zero, where there is a problem that the electromagnetic field intensity can not be calculated using wave source power.

SUMMARY OF THE INVENTION

It is an object of the present invention to at least solve the problems in the conventional technology.

An apparatus for calculating an electromagnetic field intensity according to one aspect of the present invention includes a virtual current calculator, a wave source input impedance calculator, a wave source voltage calculator, a current calculator, and an electromagnetic field intensity calculator. The virtual current calculator calculates a virtual current vector from a voltage vector and a mutual immittance matrix of an object including a wave source where a wave source power is applied. The voltage vector and the mutual immittance uses a wave voltage of the wave source as a unit voltage. The wave source input impedance calculator calculates an input impedance of the wave source based on a virtual wave source current of the virtual current vector and a unit voltage of the wave source. The wave source voltage calculator calculates the wave source voltage based on the input impedance and the wave source power. The current calculator calculates a current vector based on the wave source voltage calculated and the virtual current vector. The electromagnetic field intensity calculator calculates an electromagnetic field intensity around the wave source. The wave source power is determined based on the current vector.

A method of calculating an electromagnetic filed intensity according to another aspect of the present invention includes calculating a virtual current vector from a voltage vector and a mutual immittance matrix of an object including a wave source where a wave source power is applied. The voltage vector and the mutual immittance using a wave voltage of the wave source as a unit voltage. The method also includes calculating an input impedance of the wave source based on a virtual wave source current of the virtual current vector and a unit voltage of the wave source; calculating the wave source voltage based on the input impedance and the wave source power; calculating a current vector based on the wave source voltage calculated and the virtual current vector; and calculating an electromagnetic field intensity around the wave source. The wave source power being determined based on the current vector.

The computer program product according to still another aspect of the present invention realizes the method according to the present invention on a computer.

The other objects, features and advantages of the present invention are specifically set forth in or will become apparent from the following detailed descriptions of the invention when read in conjunction with the accompanying drawings.

DETAILED DESCRIPTION

Exemplary embodiments of an electromagnetic field intensity calculation apparatus, an electromagnetic field intensity calculation method, and an electromagnetic field intensity calculation program according to the present invention are described below, with reference to the accompanied drawings.

In a first embodiment, a case that an electromagnetic field intensity calculation apparatus according to the present invention is applied and an electromagnetic field intensity is calculated based on a wave source power will be explained. In a second embodiment, a computer system for executing an electromagnetic field intensity calculation program according to the present invention will be explained. Finally, modifications will be explained as other embodiments.

In the first embodiment, a case that an electromagnetic field intensity calculation apparatus according to the present invention is applied and an electromagnetic field intensity is calculated based on a wave source power will be explained. After outline and feature of the electromagnetic field intensity calculation apparatus according to the first embodiment is explained, the configuration of the electromagnetic field intensity calculation apparatus is explained and an electromagnetic field intensity calculation processing procedure of the electromagnetic field intensity calculation apparatus is explained.

Figure 1:
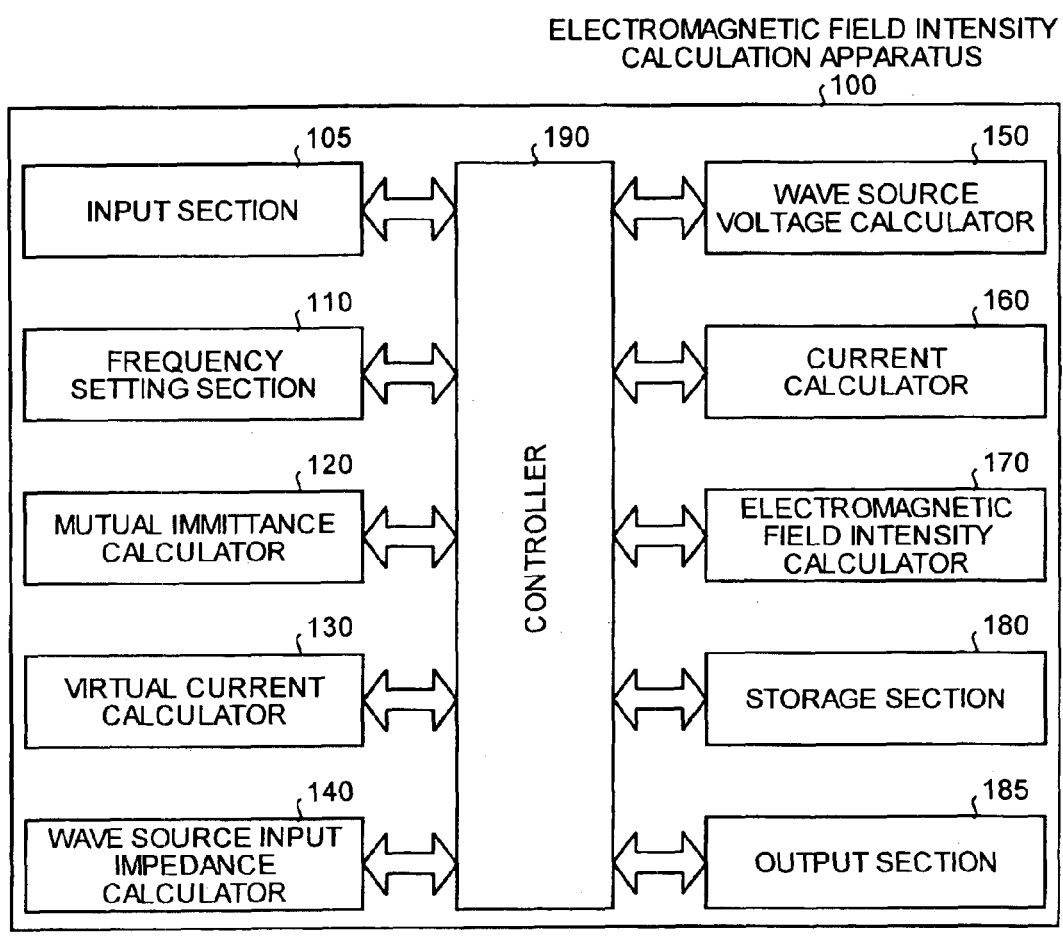
FIG. 1 is a function block diagram illustrating a configuration of an electromagnetic field intensity calculation apparatus according to the first embodiment.

The outline and a main feature of the electromagnetic field intensity calculation apparatus according the first embodiment will be explained. FIG. 1 is a function block diagram illustrating a configuration of the electromagnetic field intensity calculation apparatus according to the first embodiment.

An electromagnetic field intensity calculation apparatus 100 illustrated in FIG. 1 is an electromagnetic field intensity calculation apparatus that calculates an electromagnetic field intensity based on the moment method and the apparatus calculates an electromagnetic field intensity when a wave source power is applied.

Specifically, the electromagnetic field intensity calculation apparatus 100 according to a first aspect of the present invention calculates a virtual current vector based on a voltage vector assuming a wave source voltage as a unit voltage and a mutual immittance matrix, calculates a wave source input impedance based on the virtual wave source current of the virtual current vector and a unit voltage of a wave source, calculates a wave source voltage based on the wave source input impedance and the wave source power, and calculates a current vector based on the wave source voltage and the virtual current vector. Therefore, when the wave source power is applied, the electromagnetic field intensity can be calculated based on the moment method.

The configuration of the electromagnetic field intensity calculation apparatus according to the first embodiment will be explained. As illustrated in FIG. 1, the electromagnetic field intensity calculation apparatus 100 is an apparatus which applies the moment method to an analysis model where an object has been divided into a finite number of small elements and solves a determinant $\{Z\}=[I]=[V]$ established among the calculated mutual immittance matrix $\{Z\}$, a voltage vector $[V]$, and a current vector $[I]$ to obtain the current vector $[I]$, thereby calculating an electromagnetic field intensity radiated from the object.

Specifically, the electromagnetic field intensity calculation apparatus 100 includes an input section 105, a frequency setting section 110, a mutual immittance calculator 120, a virtual current calculator 130, a wave source input impedance calculator 140, a wave source voltage calculator 150, a current calculator 160, an electromagnetic field intensity calculator 170, a storage section 180, an output section 185, and a controller 190.

The input section 105 is a device that inputs analysis model data such as user request and/or instruction and shape data and/or property values of an object, and specifically, includes a keyboard, a mouse, or the like. Further, the frequency setting section 110 is a processor that sets a predetermined frequency when the mutual immittance matrix $\{Z\}$ is calculated. Further, the mutual immittance calculator 120 is a processor that calculates respective elements of the mutual immittance matrix $\{Z\}$.

The virtual current calculator 130 is a processor that calculates a virtual current vector $[Iv]$ from a voltage vector $[V]$ assuming a wave source voltage Vs as a unit voltage and a mutual immittance matrix $\{Z\}$, and specifically, calculates a determinant $\{Z\} [Iv]=[V]$ according to a numerical calculation method such as a Gauss-Jordan method, a Gauss-Seidel iteration method, and a successive over-relaxation method.

The wave source input impedance calculator 140 is a processor that calculates a wave source input impedance Zs based on a virtual wave source current Ivs of the virtual current vector $[Iv]$ calculated by the virtual current calculator 130 and a unit voltage of the wave source, and specifically, calculates Zs=1/Ivs.

The wave source voltage calculator 150 is a processor that calculates a wave source voltage Vs based on a wave source input impedance Zs calculated by the wave source input impedance calculator 140 and a wave source power Ps, and specifically, calculates Vs=√(Ps×|Zs|).

The current calculator 160 is a processor that calculates a current vector $[I]$ based on the wave source voltage Vs calculated by the wave source voltage calculator 150 and the virtual current vector $[Iv]$, and specifically, calculates $[I]=$ Vs×$[Iv]$.

The electromagnetic field intensity calculator 170 is a processor that, when a current vector $[I]$ of a target object is calculated, calculates a radiating electromagnetic field intensity based on the current vector. Further, the storage section 180 is a storage section in which analysis model data input from the input section 105 and data calculated by respective processors are stored.

The output section 185 is a processor that displays or outputs data calculated by respective processors, and specifically it is an image displaying apparatus such as a Cathode Ray Tube (CRT) and a Liquid Crystal Display (LCD), or a printer. Further, the controller 190 is a processor that controls all of the electromagnetic field intensity calculation apparatus 100, and specifically, receives user requests to control data flows in respective processors.

Figure 2:
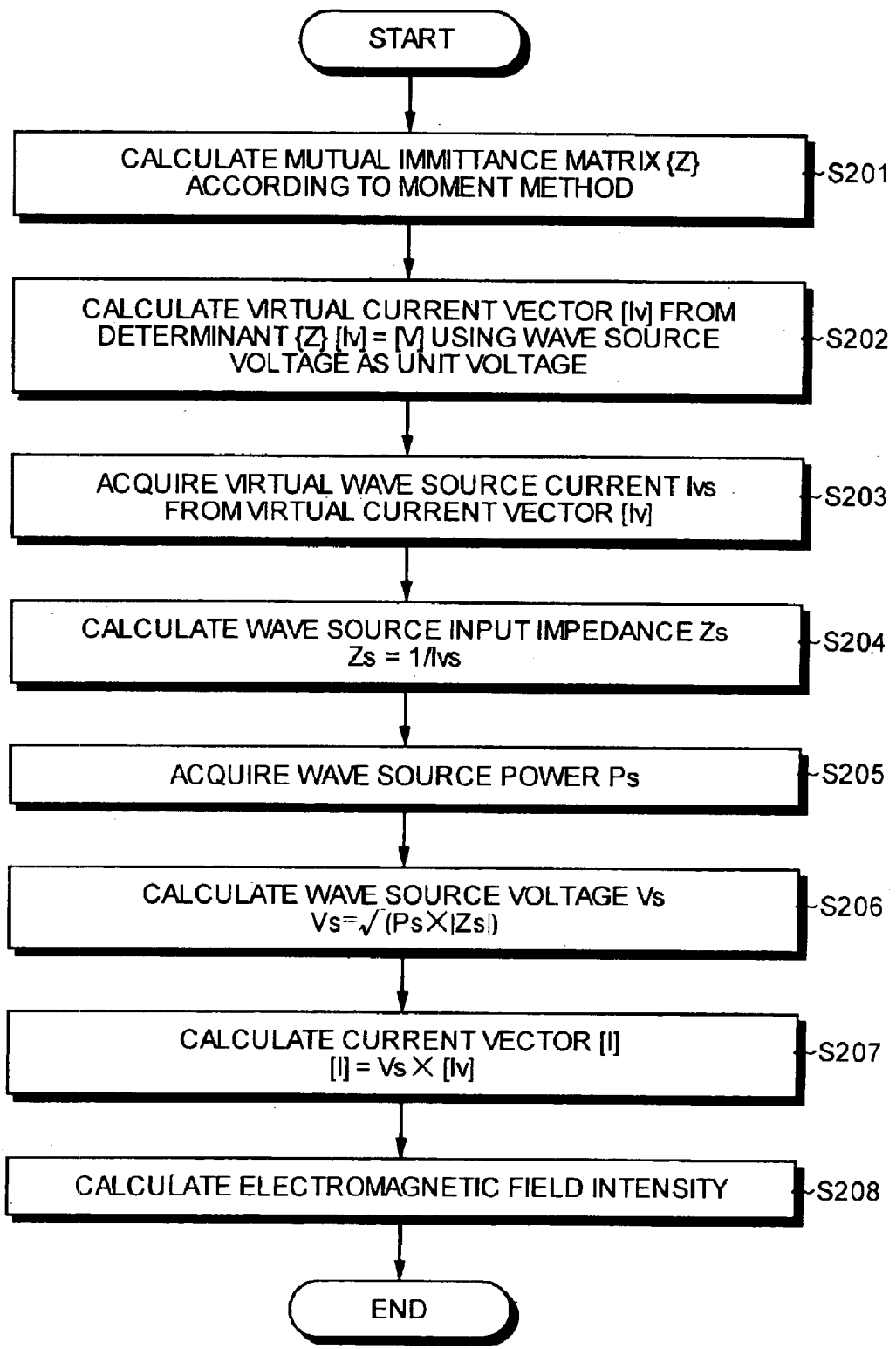
FIG. 2 is a flowchart illustrating an electromagnetic field calculation processing procedure of the electromagnetic field calculation apparatus illustrated in FIG. 1.

Next, an electromagnetic field intensity calculation processing procedure of the electromagnetic field intensity calculation apparatus illustrated in FIG. 1 will be explained with reference to FIG. 2. FIG. 2 is a flowchart illustrating an electromagnetic field intensity calculation processing procedure of the electromagnetic field intensity calculation apparatus illustrated in FIG. 1.

As illustrated in FIG. 2, the mutual immittance calculator 120 applies the moment method to an integral equation derived from Maxwell electromagnetic wave equation to perform numerical integration thereby calculating the mutual immittance matrix $\{Z\}$. Specifically, an object is divided into a finite number of small elements, a weighting function defined within the elements is multiplied to the integral equation to perform integration within the elements, thereby calculating the mutual immittance matrix $\{Z\}$ regarding the finite number of elements (Step S201).

Figure 3:
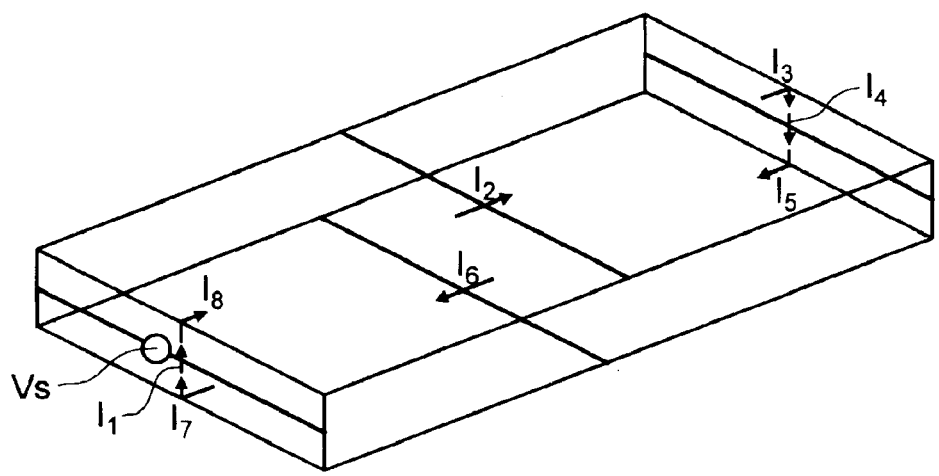
FIG. 3 is a diagram of an analysis model in the electromagnetic field intensity calculation processing procedure illustrated in FIG. 2.

Here, examples of an analysis model and a mutual immittance matrix in the electromagnetic field intensity calculation processing procedure will be explained. FIG. 3 is a diagram of an analysis model in the electromagnetic field intensity calculation processing procedure illustrated in FIG. 2.

As illustrated in FIG. 3, an analysis model is a printed board divided into eight elements. A wave source exists at a position indicated by a mark ○ in FIG. 3, and when a unit voltage is applied as a wave source voltage Vs, currents $I_1$ to $I_8$ flow between elements.

First, for the eight elements of the printed board, mutual immittances are calculated according to the moment method to compose from the respective mutual immittances of the eight elements a symmetrical mutual immittance matrix composed of eight rows and eight columns as the following determinant (1):

$$\begin{bmatrix} Z_{11} & Z_{12} & Z_{13} & Z_{14} & Z_{15} & Z_{16} & Z_{17} & Z_{18} \\ & Z_{22} & Z_{23} & Z_{24} & Z_{25} & Z_{26} & Z_{27} & Z_{28} \\ & & Z_{33} & Z_{34} & Z_{35} & Z_{36} & Z_{37} & Z_{38} \\ & & & Z_{44} & Z_{45} & Z_{46} & Z_{47} & Z_{48} \\ & & & & Z_{55} & Z_{56} & Z_{57} & Z_{58} \\ & & & & & Z_{66} & Z_{67} & Z_{68} \\ & & & & & & Z_{77} & Z_{78} \\ & & & & & & & Z_{88} \end{bmatrix} \begin{bmatrix} I_1 \\ I_2 \\ I_3 \\ I_4 \\ I_5 \\ I_6 \\ I_7 \\ I_8 \end{bmatrix} = \begin{bmatrix} 1 \\ 0 \\ 0 \\ 0 \\ 0 \\ 0 \\ 0 \\ 0 \end{bmatrix} \quad (1)$$

where the first factor in the left hand side is the symmetrical mutual immittance matrix, the second factor in the left hand side is the current vector, and the term in the right hand side is the voltage vector.

Since a surface of each element is metal, the determinant (1) is numerically analyzed so as to meet such a boundary condition that a voltage except the wave source is zero, so that currents $I_1$ to $I_8$ flowing between the elements are calculated.

Referring to FIG. 2 again, the virtual current calculator 130 calculates a virtual current vector [Iv] from a voltage vector [V] assuming the wave source voltage as a unit voltage and a mutual immittance matrix {Z} (Step S202).

The wave source input impedance calculator 140 acquires a virtual wave source current Ivs from the virtual current vector [Iv] calculated by the virtual current calculator 130 (Step S203) and calculates a wave source input impedance Zs based on the virtual wave source current Ivs and the unit voltage Vs of the wave source. Specifically, the wave source input impedance calculator 140 calculates Zs=1/Ivs (Step S204).

Further, the wave source voltage calculator 150 acquires a wave source power Ps (Step S205) and calculates a wave source voltage Vs based on an absolute value of the wave source input impedance Zs calculated by the wave source input impedance calculator 140 and the wave source power Ps. Specifically, the wave source voltage calculator 150 calculates Vs=√(Ps×|Zs|) (Step S206).

The current calculator 160 calculates a current vector [I] based on the wave source voltage Vs obtained by the wave source voltage calculator 150 and the virtual current vector [Iv]. Specifically, the current calculator 160 calculates [I]= Vs×[Iv] (Step S207).

As a result, after the current vector [I] of the target object is calculated by the current calculator 160, the electromagnetic field intensity calculator 170 calculates a radiating electromagnetic field intensity based on the current vector [I] (Step S208).

As explained above, according to the present invention, since the constitution is made so as to calculate the virtual current vector from the voltage vector assuming the wave source voltage as the unit voltage and the mutual immittance matrix, calculate the wave source input impedance based on the virtual wave source current of the virtual current vector and the unit voltage of the wave source, calculate the wave source voltage based on the wave source input impedance and the wave source power, and calculate the current vector based on the wave source voltage and the virtual current vector, the electromagnetic field intensity can be calculated based on the moment method when the wave source power is applied.

The electromagnetic field intensity calculation apparatus and the electromagnetic field intensity calculation method explained in the above first embodiment can be realized by executing a program prepared in advance with a computer system such as a personal computer and a workstation. In the second embodiment, a computer system for executing an electromagnetic field intensity calculation program, which has a function similar to the electromagnetic field intensity calculation apparatus explained in the first embodiment will be explained.

Figure 4:
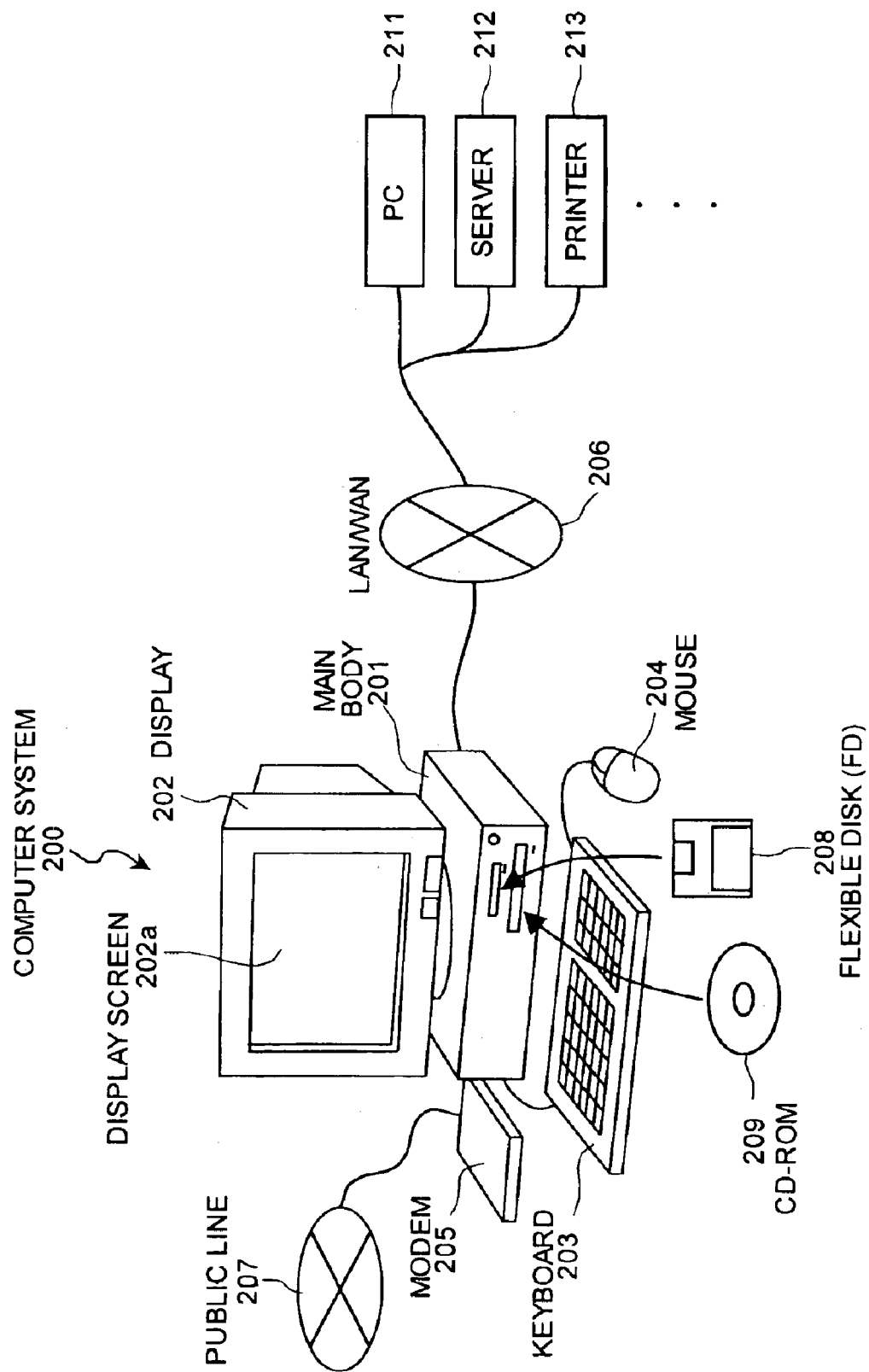
FIG. 4 is a system configuration diagram illustrating a configuration of a computer system according to the second embodiment.
Figure 5:
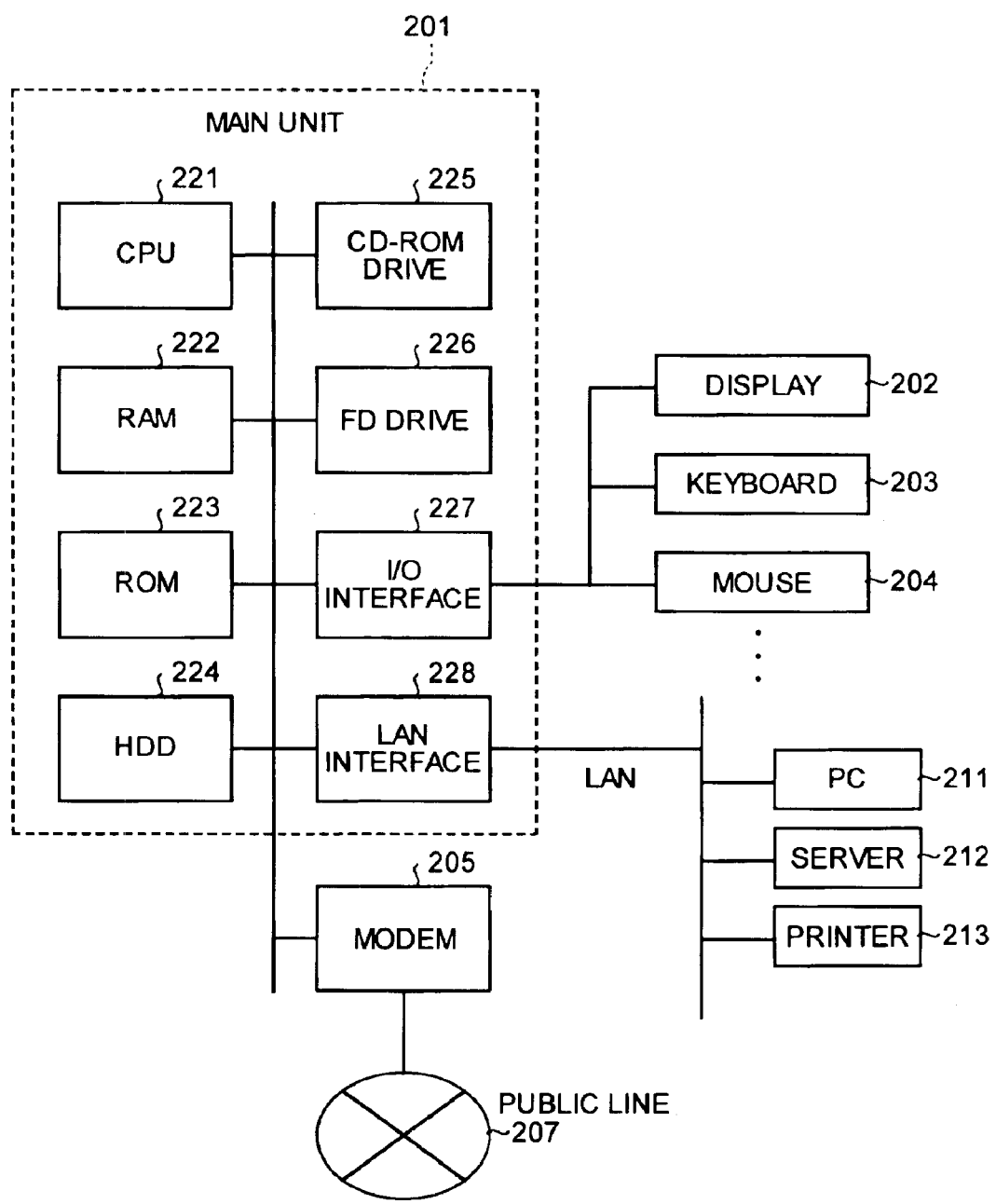
FIG. 5 is a block diagram illustrating a configuration of a main body in the computer system illustrated in FIG. 4.

FIG. 4 is a system configuration diagram illustrating a configuration of a computer system according to the second embodiment, and FIG. 5 is a block diagram illustrating a configuration of a main body in the computer system. As illustrated in FIG. 4, a computer system 200 according to this embodiment includes a main body 201, a display 202 for displaying information such as an image on a display screen 202a according to an instruction from the main body 201, a key board 203 for inputting various pieces of information into the computer system 200, and a mouse 204 for pointing an arbitrary position on the display screen 202a of the display 202.

As illustrated in FIG. 5, the main body 201 in the computer system 200 includes a Central Processing Unit (hereinafter, "CPU") 221, a Random Access Memory (hereinafter, "RAM") 222, a Read Only Memory (hereinafter, "ROM") 223, a Hard Disk Drive (hereinafter, "HDD") 224, a CD-ROM drive 225 receiving a CD-ROM 209, a Flexible Disk (hereinafter, "FD") drive 226 receiving an FD 208, an Input/Output (I/O) interface 227 connected to the display 202, the keyboard 203, and the mouse 204, and a Local Area Network (hereinafter, "LAN") interface 228 connected to a Local Area Network or a Wide Area Network (hereinafter, "LAN/WAN") 206.

The computer system 200 is connected with a modem 205 for connection to a public line 207 such as Internet and is connected with another computer system (Personal Computer (PC)) 211, a server 212, a printer 213, and the like via the LAN interface 228 and the LAN/WAN 206.

The computer system 200 realizes the electromagnetic field intensity calculation apparatus by reading and executing the electromagnetic field intensity calculation program recorded on a predetermined recording medium. The predetermined recording medium includes any recording medium on which an electromagnetic field intensity calculation program which can be read by the computer system 200 is recorded, for example, not only "a portable physical medium" such as the FD 208, the CD-ROM 209, a Magneto Optical Disk (MO), a Digital Versatile Disk (DVD), an IC card, but also "a fixed physical medium" such as the HDD 224, the RAM 222, the ROM 223 provided inside or outside the computer system 200, and "a communication medium" temporary holding a program at a time of program transmission such as the public line 207 connected via the modem 205, the LAN/WAN 206 connected with another computer system 211, and the server 212.

That is, the electromagnetic field intensity calculation program is recorded on a recording medium such as the above-described "portable physical medium", "fixed physical medium", and "communication medium" in a computer readable manner, and the computer system 200 realizes the electromagnetic field intensity calculation apparatus and the electromagnetic field intensity calculation method by reading the electromagnetic field intensity calculation program from such a recording medium to execute the same. The electromagnetic field intensity calculation program is not limited to a case executed by the computer system 200, but the present invention is applicable when another computer system 211 or the server 212 executes the electromagnetic field intensity calculation program, or when these system and server execute the electromagnetic field intensity calculation program in cooperation with each other.

The first and the second embodiments are described as above, however, variously modified embodiments other than the two embodiments can be made without departing from the scope of the technical spirit of the appended claims.

In the embodiment, for example, the case that the present invention is applied to the moment method is explained, but this invention is not limited to this case. It can be also applied to other analysis approaches, for example, an approach that uses distributed multiple line approximation.

Further, all or some of processings automatically performed of the respective processings explained in the embodiments may be performed manually, or all or some of processings manually performed thereof may be performed automatically in a known method. In addition, the processing procedure, the control procedure, the specific names, and the information including various data or parameters described above or illustrated in the drawings can be changed arbitrarily except for the specially mentioned case.

Furthermore, respective constituent elements of the respective apparatuses illustrated are conceptual regarding their functions, and they are not required as illustrated physically necessarily. That is, a specific aspect of distribution/integration of respective apparatuses is not limited to the illustrated embodiments, but all or some of the respective apparatuses can be constituted by distributing/integrating them functionally or physically in an arbitrary unit according to respective loads and use statuses. Further, all or some of the respective processing functions performed in the respective apparatuses can be realized by a CPU or a program(s) analyzed and executed by the CPU, or they can be realized as a hardware including a wired logic.

According to the present invention, since the constitution is made so as to calculate the virtual current vector from the voltage vector assuming the wave source voltage as the unit voltage and the mutual immittance matrix, calculate the wave source input impedance based on the virtual wave source current of the virtual current vector and the unit voltage of the wave source, calculate the wave source voltage based on the wave source input impedance and the wave source power, and calculate the current vector based on the wave source voltage and the virtual current vector, the electromagnetic field intensity can be calculated based on the moment method when the wave source power is applied.

Although the invention has been described with respect to a specific embodiment for a complete and clear disclosure, the appended. Claims are not to be thus limited but are to be construed as embodying all modifications and alternative constructions that may occur to one skilled in the art which fairly fall within the basic teaching herein set forth.

What is claimed is:

1. An apparatus for calculating an electromagnetic field intensity, comprising:

a virtual current calculator that calculates a virtual current vector from a voltage vector and a mutual immittance matrix of an object including a wave source where a wave source power is applied, the voltage vector and the mutual immittance using a unit voltage as a wave voltage of the wave source;

a wave source input impedance calculator that calculates an input impedance of the wave source based on a virtual wave source current of the virtual current vector and a unit voltage of the wave source;

a wave source voltage calculator that calculates the wave source voltage based on the input impedance and the wave source power;

a current calculator that calculates a current vector based on the wave source voltage calculated and the virtual current vector; and an electromagnetic field intensity calculator that calculates an electromagnetic field intensity around the wave source, the wave source power being determined based on the current vector.

2. A method of calculating an electromagnetic field intensity, comprising:

calculating a virtual current vector from a voltage vector and a mutual immittance matrix of an object including a wave source where a wave source power is applied, the voltage vector and the mutual immittance using a unit voltage as a wave voltage of the wave source; and calculating an input impedance of the wave source based on a virtual wave source current of the virtual current vector and a unit voltage of the wave source;

calculating the wave source voltage based on the input impedance and the wave source power;

calculating a current vector based on the wave source voltage calculated and the virtual current vector; and calculating an electromagnetic field intensity around the wave source, the wave source power being determined based on the current vector.

3. A computer program product including computer executable instructions stored on a computer readable medium, wherein the instructions, when executed by the computer, cause the computer to perform:

calculating a virtual current vector from a voltage vector and a mutual immittance matrix of an object including a wave source where a wave source power is applied, the voltage vector and the mutual immittance using a unit voltage as a wave voltage of the wave source; and calculating an input impedance of the wave source based on a virtual wave source current of the virtual current vector and a unit voltage of the wave source;

calculating the wave source voltage based on the input impedance and the wave source power;

calculating a current vector based on the wave source voltage calculated and the virtual current vector; and calculating an electromagnetic field intensity around the wave source, the wave source power being determined based on the current vector.

* * * * *